US006836020B2

(12) United States Patent
Cheng et al.

(10) Patent No.: US 6,836,020 B2
(45) Date of Patent: Dec. 28, 2004

(54) ELECTRICAL THROUGH WAFER INTERCONNECTS

(75) Inventors: Ching-Hsiang Cheng, Palo Alto, CA (US); Arif S. Ergun, Mountain View, CA (US); Butrus T. Khuri-Yakub, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 10/349,597

(22) Filed: Jan. 22, 2003

(65) Prior Publication Data

US 2004/0141421 A1 Jul. 22, 2004

(51) Int. Cl.[7] .............................................. H01L 29/40
(52) U.S. Cl. ..................................................... 257/774
(58) Field of Search ................................ 257/774, 618, 257/595, 496, 602

(56) References Cited

U.S. PATENT DOCUMENTS

| | | | | |
|---|---|---|---|---|
| 5,619,476 A | * | 4/1997 | Haller et al. ................. | 367/181 |
| 5,870,351 A | * | 2/1999 | Ladabaum et al. .......... | 367/163 |
| 5,894,452 A | * | 4/1999 | Ladabaum et al. .......... | 367/163 |
| 6,430,109 B1 | * | 8/2002 | Khuri-Yakub et al. ....... | 367/181 |
| 6,674,126 B2 | * | 1/2004 | Iwamoto et al. ............. | 257/341 |

OTHER PUBLICATIONS

Alizadeh–Taheri, B., et al., "An Active, Microfabricated, Scalp Electrode–Array for EEG Recording", *Transducers '95—Eurosensers IX*, The 8th International Conference on Solid–State Sensors and Actuators, and Eurosensors IX, Stockholm, Sweden, Jun. 25–29, 1995, pp. 67–70.

Bollmann, D., et al., "Invited paper: Three Dimensional Metallization for Vertically Integrated Circuits", *Materials for Advanced Metallization*, 1997, pp. 94–98.

Burger, G.J., et al., "High Resolution Shadow Mask Patterning in Deep Holes and Its Application to an Electrical Wafer Feed–Through", *Transducers '95—Eurosensors IX*, The 8th International Conference on Solid–State Sensors and Actuators, and Eurosensors IX. Stockholm, Sweden, Jun. 25–29, 1995, pp. 573–576.

Calmes, S., et al., "Highly Integrated 2–D Capacitive Micromachined Ultrasonic Transducers", 1999 IEEE Ultrasonics Symposium, *IEEE*, 1999, pp. 1163–1166.

Cheng, C.H., et al., "An Efficient Electrical Addressing Method Using Through–Wafer Vias for Two–Dimensional Ultrasonic Arrays", 2000 IEEE Ultrasonics Symposium, *IEEE*, 2000, pp. 1179–1182.

Christensen, C., et al., "Wafer Through–Hole Interconnections with High Vertical Wiring Densities", *IEEE*, Dec. 1996, 19(4):516–522.

Fujita, Y., et al., "Feasibility Study on Through–Wafer Interconnecting Method for Hybrid Wafer–Scale –Integration", *IEEE*, 1999, pp. 1081–1084.

(List continued on next page.)

Primary Examiner—Roy Potter
(74) Attorney, Agent, or Firm—Dorsey & Whitney LLP

(57) ABSTRACT

A wafer with through wafer interconnects. The wafer includes spaced through wafer vias which extend between the back side and front side of the wafer. A conductor within each of said vias connects to front and back side pads. Functions associated with said conductor and said pads provide a depletion region in the wafer between the pads and wafer or pads and conductor and the wafer.

20 Claims, 6 Drawing Sheets

OTHER PUBLICATIONS

Heschel, M., et al., "Conformal Coating By Photoresist Of Sharp Corners Of Anisotropically Etched Through–Holes In Silicon", *Transducers '97*, 1997 International Conference on Solid–State and Actuators, Chicago, Jun. 16–19, 1997, pp. 209–212.

Li, X., et al., "High Density Electrical Feedthrough Fabricated by Deep Reactive Ion Etching of Pyrex Glass", *IEEE*, 2001, pp. 98–101.

Linder, S., et al., "Fabrication Technology for Wafer Through–Hole Interconnections and Three–Dimensional Stacks of Chips and Wafers", *IEEE*, 1994, pp. 349–354.

Little, M.J., et al., "The 3–D Computer", *IEEE*, 1989, pp. 55–72.

Liu, C., et al., "Through–Wafer Electrical Interconnects by Sidewall Photolithographic Patterning", *IEEE*, 1998, pp. 1402–1405.

Kuhmann, J.F., et al., "Through Wafer Interconnects and Flip–Chip Bonding: A Toolbox for Advanced Hybrid Technologies for MEMS", *Eurosensors XIII*, The 13$^{th}$ European Conference on Solid–State Transducers, Sep. 12–15, 1999, The Hague, The Netherlands, pp. 265–272.

Mita, Y., et al., "Two Dimensional Micro Conveyance System with Through Holes for Electrical and Fluidic Interconnection", *Transducers '97*, 1997 International Conference on Solid–State Sensors and Actuators, Chicago, Jun. 16–19, 1997, *IEEE*, 1997, pp. 37–40.

Nguyen, N.T., et al., "Through–wafer copper electroplating for three–dimensional interconnects", *J. Micromech. Microeng.*, 2002, 12:395–399.

Takahata, K., et al., "Batch Mode Micro–EDM for High–Density and High–Throughput Micromachining", *IEEE*, 2001, pp. 72–75.

Wu, J.H., et al., "A High Aspect–Ratio Silicon Substrate–Via Technology and Applications: Through–Wafer Interconnects for Power and Ground and Faraday Cages for SOC Isolation", *IEEE*, 2000, pp. 477–480.

Kallis, J.M., et al., "Reliability of the 3–D Computer Under Stress of Mechanical Vibration and Thermal Cycling", *IEEE*, 1989, pp. 65–72.

* cited by examiner

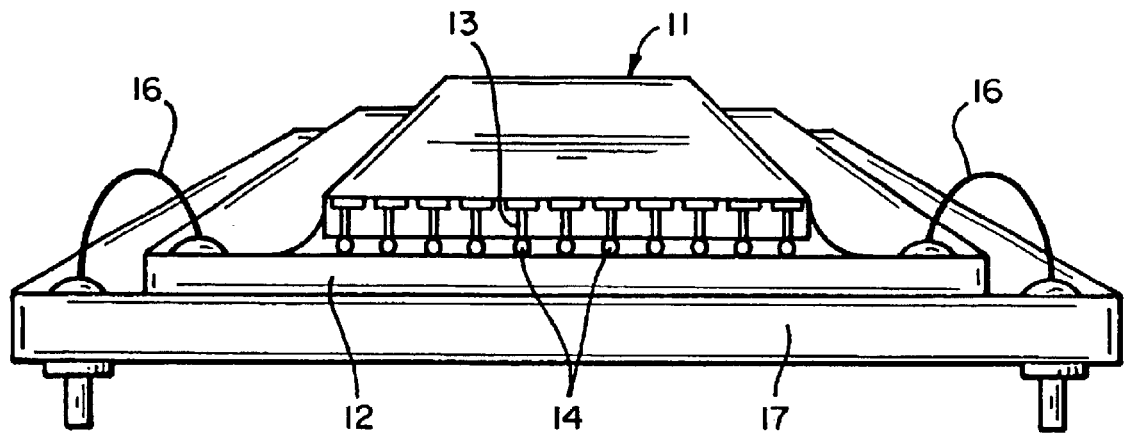
FIG_1
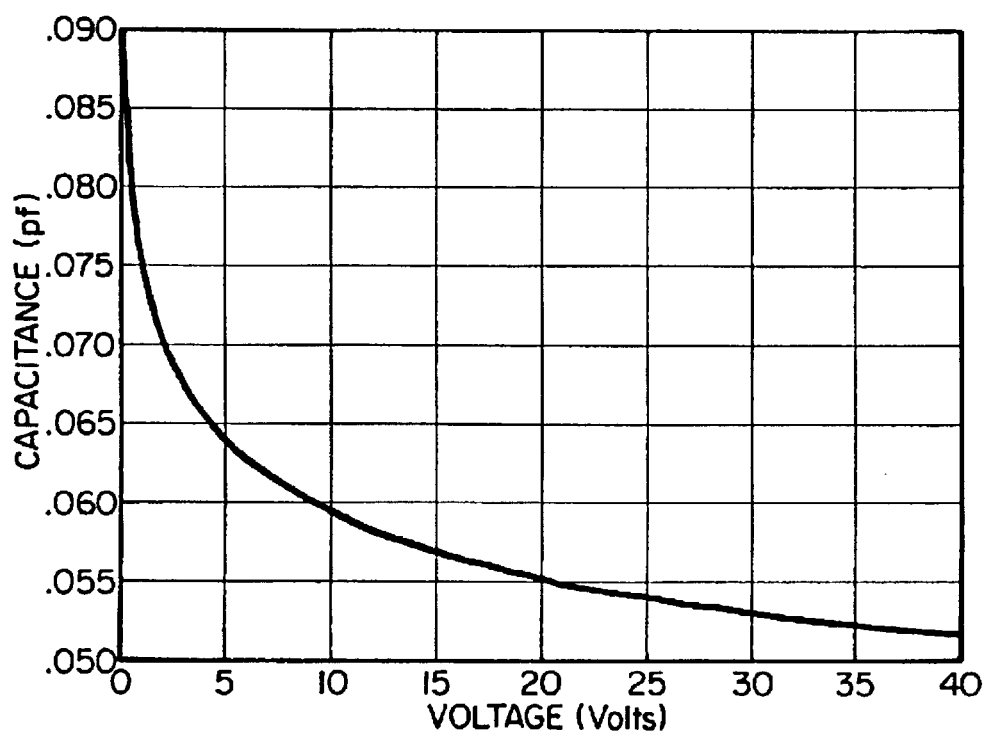
FIG_6

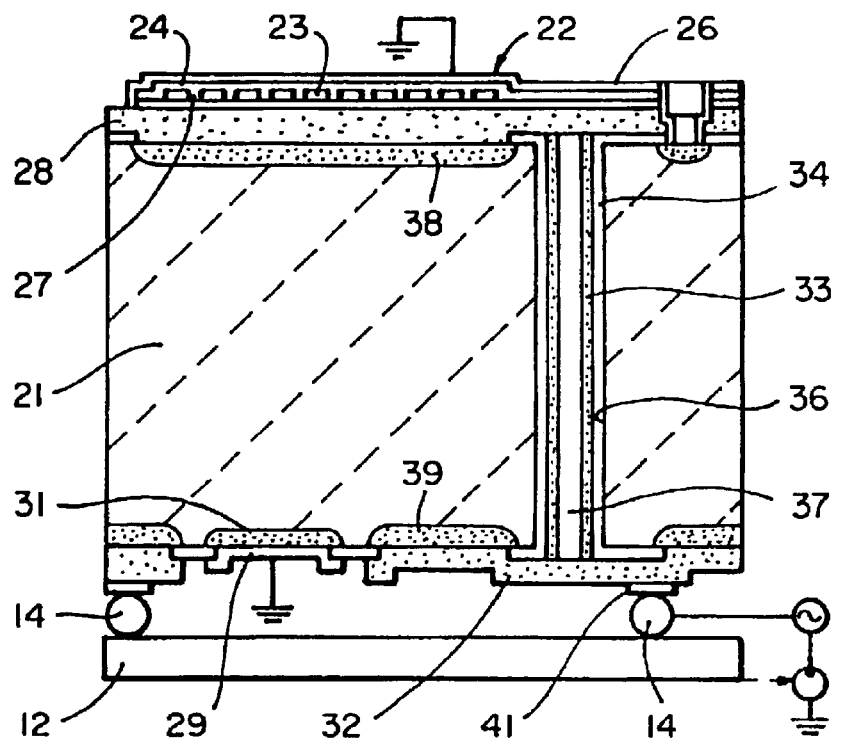
FIG_2
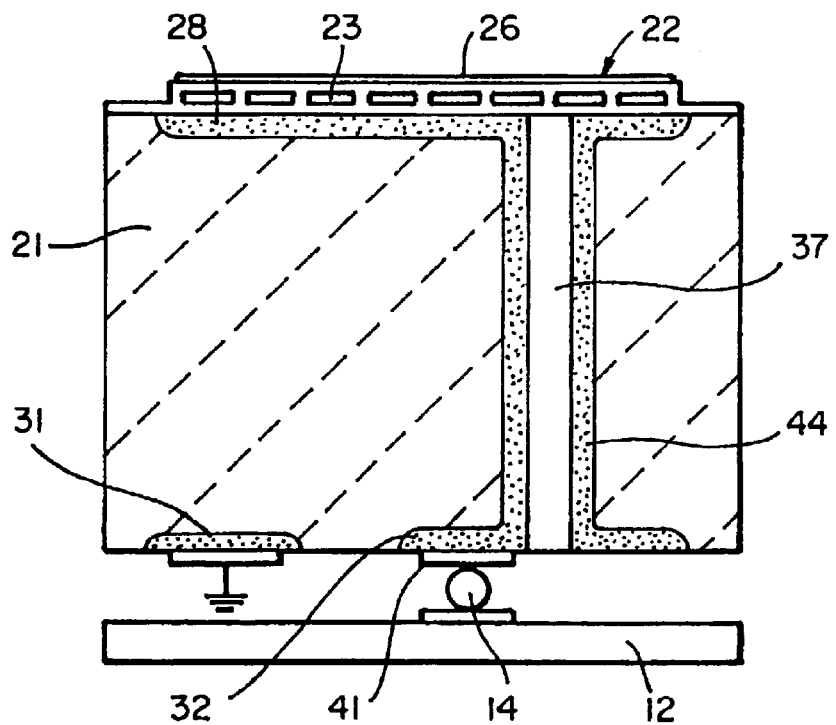
FIG_3

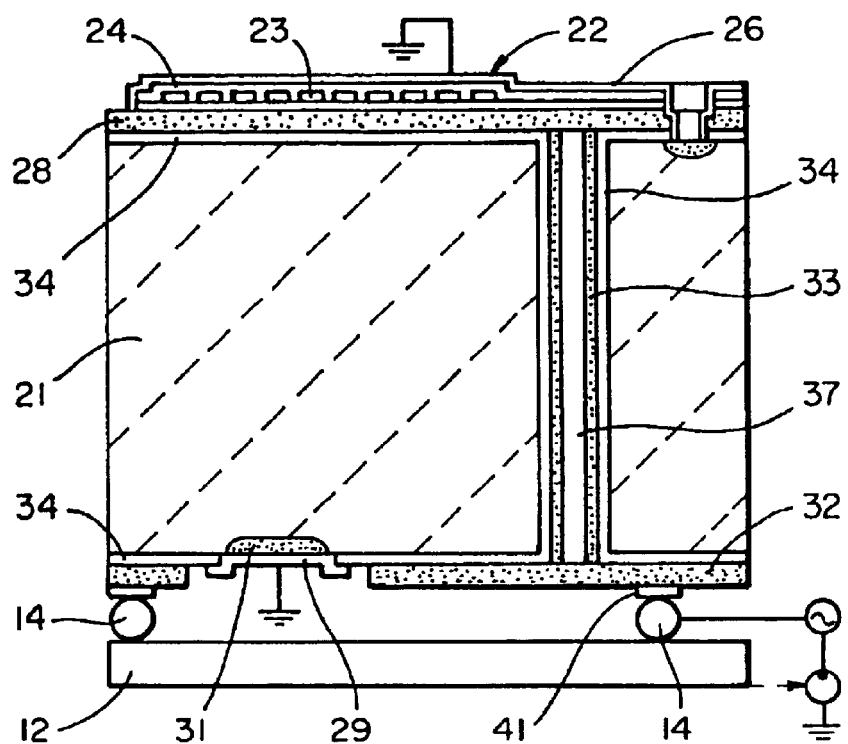
FIG_4
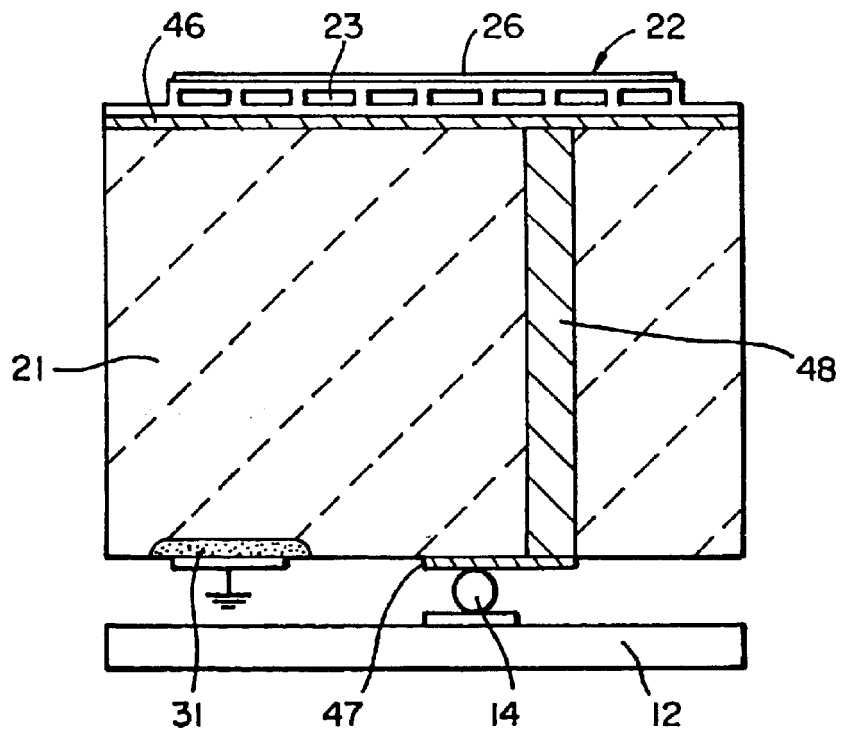
FIG_5

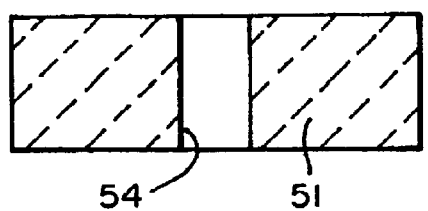
FIG_7a
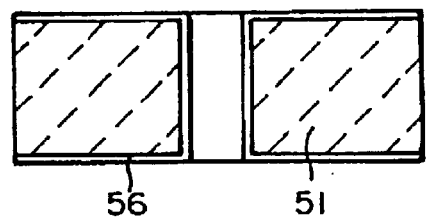
FIG_7b
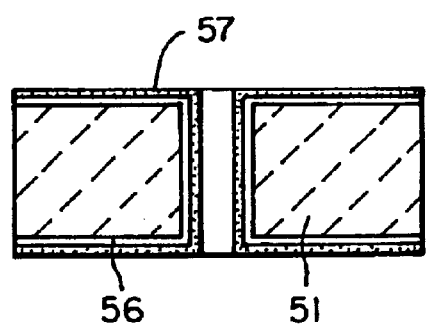
FIG_7c
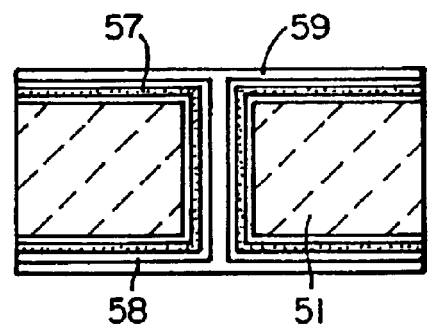
FIG_7d
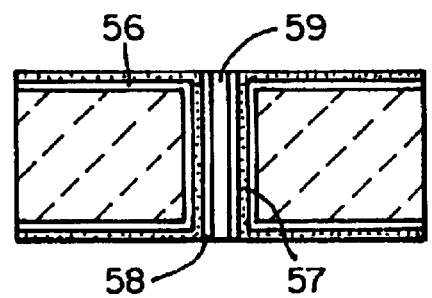
FIG_7e
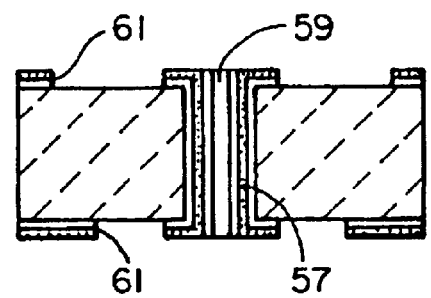
FIG_7f
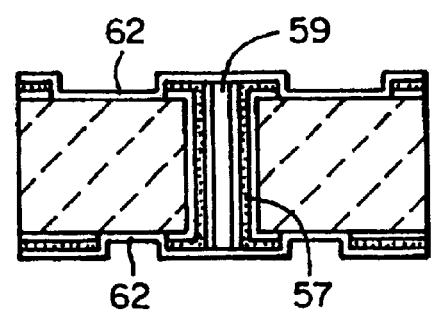
FIG_7g
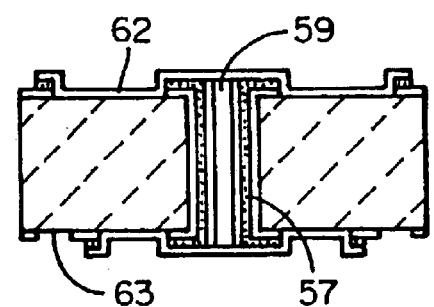
FIG_7h

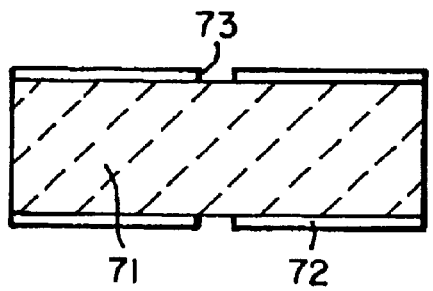
FIG_8a
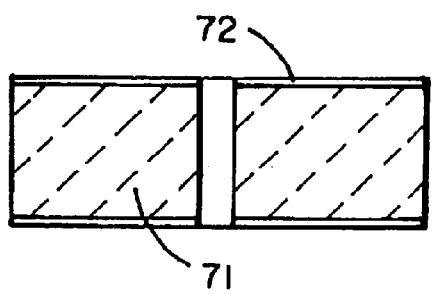
FIG_8b
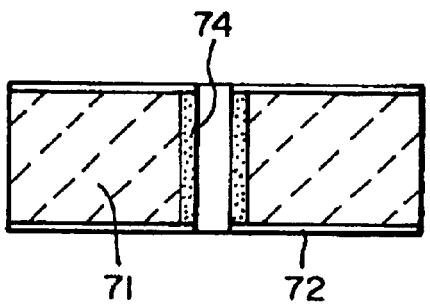
FIG_8c
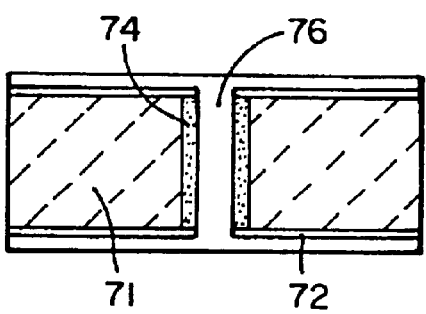
FIG_8d
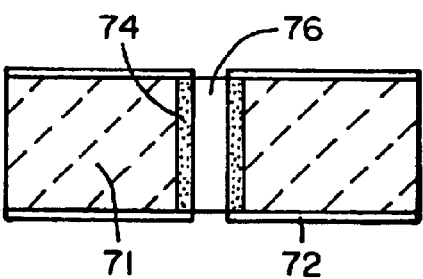
FIG_8e
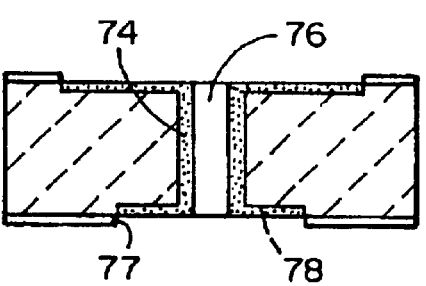
FIG_8f
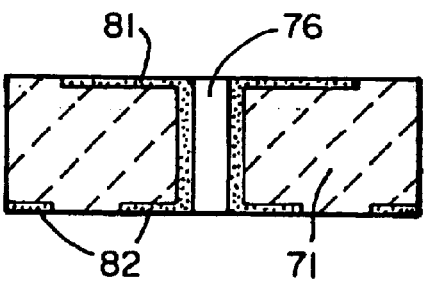
FIG_8g
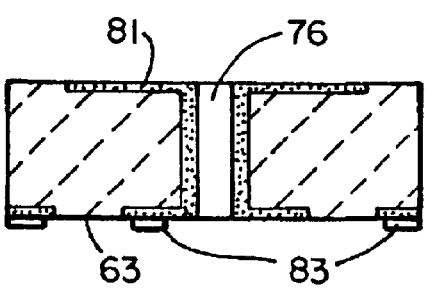
FIG_8h

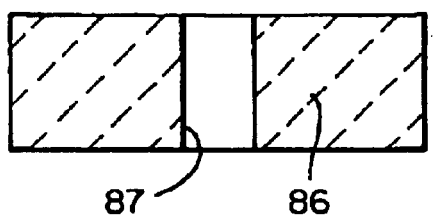
FIG_9a
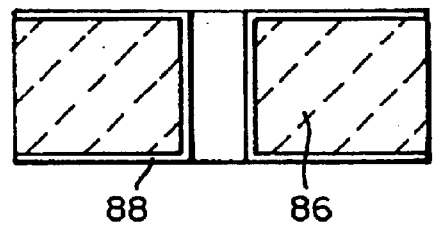
FIG_9b
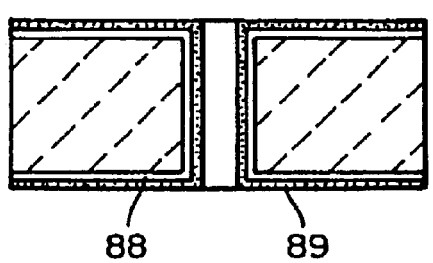
FIG_9c
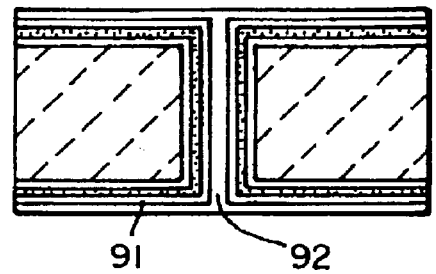
FIG_9d
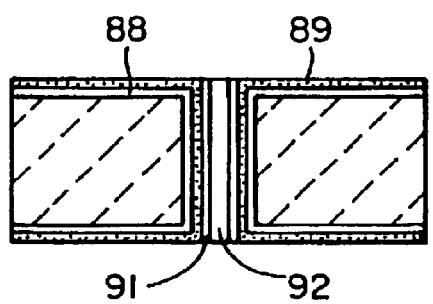
FIG_9e
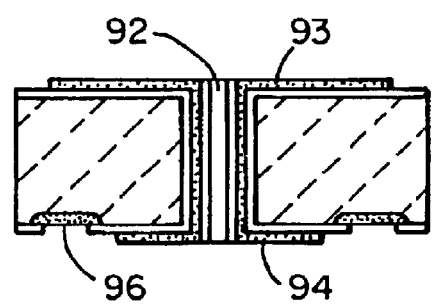
FIG_9f
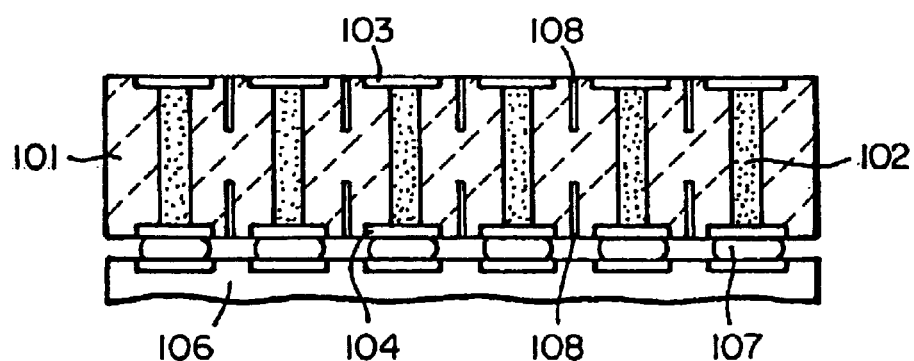
FIG_10

ELECTRICAL THROUGH WAFER INTERCONNECTS

GOVERNMENT SUPPORT

This invention was made with Government support under Contract No. N00014-98-0634 awarded by the Department of the Navy, Office of Naval Research. The Government has certain rights in this inventiom.

BRIEF DESCRIPTION OF THE INVENTION

This invention relates generally to electrical through wafer interconnects and more particularly to through wafer interconnects in which the parasitic capacitance is minimized.

BACKGROUND OF THE INVENTION

In co-pending application Ser. No. 09/667,203 filed Sep. 21, 2000, there is described an ultrasonic transducer with through wafer connections. Capacitive micro machined ultrasonic transducer arrays include membranes which are supported on the front side of a substrate or wafer by isolator supports such as silicon nitride, silicon oxide and polyimide. Transducers of this type are described, for example, in U.S. Pat. Nos. 5,619,476; 5,870,351; and 5,894,452. Micromachined two-dimensional arrays of droplet ejectors which include a flexible membrane supported on a substrate are described, for example, in U.S. Pat. No. 6,474,786. Other two-dimensional device arrays such as for example, arrays of vertical cavity surface emitting lasers, mirrors, piezoelectric transducers, photo detectors and light emitting diodes are formed on and supported by the front side of wafers or substrates.

One of the main problems in fabricating two dimensional arrays is that of addressing the individual array elements. If the array size is large, a significant sacrifice in the array element area is required if the addressing is done through a routing network on the top side of the substrate. The interconnect between the array elements and their electronics gives rise to parasitic capacitance which limits the dynamic range and frequency bandwidth of the device array. It is therefore advantageous to have the electronic circuitry as close to the array elements as possible. However, integrating the devices, the electronics and the interconnects on the same wafer leads to a compromise in the performance of both the electronics and the device array.

An excellent solution to the problem is to fabricate separately the optimum device array and the electronics, provide through wafer interconnects with high aspect ratio and the flip chip bond the wafer to the electronics. This also provides a lower parasitic capacitance between the electronic circuit and the array elements. However it is desirable to further reduce the parasitic capacitance.

OBJECTS AND SUMMARY OF THE INVENTION

In accordance with the invention, the reduction in parasitic capacitance is achieved by employing reverse biased pn, Schottky junctions, or MIS (Metal Insulator Semiconductor) biasing to depletion in the interconnects.

It is an object of the present invention to provide a wafer with through wafer interconnects with a low parasitic capacitance and resistance.

It is a further object of the present invention to provide a wafer which includes front side and back side pads and a through wafer interconnect with low parasitic capacitance and resistance.

There is provided a wafer with through wafer interconnect. The wafer included spaced through wafer vias which extend between the back side and front side of the wafer, a conductor within each of the vias connected to front and back side pads and means associated with said conductor and pads and the wafer for providing a depletion region in the wafer between the conductor and pads.

BRIEF DESCRIPTION OF THE DRAWINGS

The invention will be more clearly understood from the following description when read in conjunction with the accompanying drawings in which:

FIG. 1 is a perspective view of micromachined devices (MEMS) with through wafer interconnects;

FIG. 2 is a sectional view showing a wafer with a through wafer interconnect in accordance with our embodiment of the present invention;

FIG. 3 is a sectional view showing a wafer with a through wafer interconnect in accordance with still a further embodiment of the present invention;

FIG. 4 is a sectional view showing a wafer with a through wafer interconnect in accordance with still another embodiment of the present invention;

FIG. 5 is a sectional view showing a wafer with a through wafer interconnect in accordance with still another embodiment of the present invention;

FIG. 6 is a curve showing the expected capacitance-voltage relationship for a pn junction interconnect;

FIG. 7 shows the process steps for fabricating a wafer with through wafer MIS vias and pn-junction pads;

FIG. 8 shows the process steps for fabricating a wafer with through wafer interconnect with pn junction vias and pads;

FIG. 9 shows the process steps for fabricating a wafer with through wafer interconnect with MIS vias and pads;

FIG. 10 schematically shows a wafer with through wafer interconnects with trenches for reduction of thermal mismatch between the device array and the electronics.

DESCRIPTION OF PREFERRED EMBODIMENTS

FIG. 1 shows MEMS devices 11 connected to integrated circuits 12 with through wafer interconnects 13 and solder bumps 14. The integrated circuit (electronics) 12 is shown wire bonded 16 to a printed circuit board 17. The MEMS array is connected with the electronic circuits without sacrificing the performance of either one and minimizing the parasitic capacitance. In transducer array operation the parasitic capacitance of the interconnect between an array element and its electronics is the limiting factor for the dynamic range and frequency bandwidth. Therefore, it is always best to put the electronics as close to the array elements as possible. To do this, an electrical through wafer interconnect (ETWI) is employed to address the array elements individually, where the front side of the wafer is fully populated with the array elements and the backside is solely dedicated to bond pads for the flip-chip bonding to the printed circuit board (PCB) or the integrated circuits as shown in FIG. 1. In this way, the parasitics due to any interconnection cable or traces are avoided. To further improve the device performance, the parasitic capacitance of the ETWI to the silicon substrate needs to be reduced to a comparatively lower level than the device capacitance. For each array element, there are three sources contributing to the parasitic, the front side pad for the transducers, the back side pad for the bonding, and the through wafer interconnect.

One of the solutions for the parasitic reduction is to implement reverse-biased pn junction on the front and backside pads of the wafer and an MIS junction interconnects. Referring to FIG. 2, a small section of a wafer 21 is shown with one ultrasonic transducer 22 formed on the front side of the wafer. The transducer includes active cells 23, which comprise flexible membranes 24 having a top (ground) electrode 26 supported by insulating supports 27 and a bottom signal electrode 28. A detailed description of the fabrication of ultrasonic transducers is found in the above-referenced patents which are incorporated herein in their entirety by reference. The top electrode is connected to ground 29 through ohmic contact 31 with the wafer 21. The bottom electrode 28 comprises the top side pad and is connected to the back side pad 32 by via conductor 33 formed on the oxide layer 34 grown in the via 36. The via may be sealed by polysilicon filler 37. Diffusion regions 38 and 39 are formed in the wafer or substrate 21 and define pn junctions which can be reverse biased by applying a dc voltage to the interconnect and pads to provide a depletion layer. When the pn junctions are reverse biased, the high resistivity (>1000 ohm-cm) silicon substrate is fully depleted achieving a low parasitic capacitance at the top side and back side pads. The back side pads are connected to the processing or integrated circuit 12 by solder pads 41 and solder bumps 14.

Another solution for parasitic capacitance reduction is to implement reverse biased pn-junction diodes inside the interconnects as well as at the pads as shown in FIG. 3. In FIG. 3 parts like those in FIG. 2 have the same reference numbers and are not further described. The front side pads 28, back side pads 32 and the through via interconnects 44 comprise highly doped regions which serve as the conductors. The regions form pn junctions which can be reverse biased.

When a reverse bias dc voltage is applied to the pn junction, the high resistivity (>1000 ohm-cm) silicon substrate is fully depleted from electrons, thus a low parasitic capacitance is achieved.

As an example let us consider a top side 400 m×400 m pad, a 140 m×200 m back side pad, a 20 m diameter via and a 400 m thick wafer having a resistivity of 1000 ohm-cm with a reverse biased voltage driving the junction diode into the depletion region. The expected capacitance-voltage relationship is show in FIG. 6. We expect the total parasitic capacitance to be lower that 0.06 pF for a reverse bias voltage of more than 10 volts. This includes capacitance of the front and backside pads and a single through-wafer interconnect. This is a substantial improvement over previously reported results. The predicted series resistance is 434 which assumes that the doping profile is the same for the surfaces on top of the wafer and inside the via holes.

Another solution for parasitic capacitance reduction is to implement MIS junction inside the interconnects at the pads as well as inside the interconnects as shown in FIG. 4. The MIS junction will give a better electrical isolation for high voltage applications. It will also give certain amount of parasitic capacitance reduction when biasing to depletion although not as good as using reverse-biased pn junction. In FIG. 4 parts like those in FIG. 2 have the same reference numbers and are not further described. The front side pads 28, back side pads 32 and the through via interconnects 33 comprise doped polysilicon which serve as the conductors.

The regions form MIS junction which can be biased to depletion. When the MIS junctions are biased to depletion, the high resistivity (>1000 ohm-cm) silicon substrate is depleted to certain width (>9 m)achieving a low parasitic capacitance at the via, the top side, and the back side pads.

Another solution for the parasitic reduction is to implement reverse-biased Schottky diodes on the front and backside pads of the wafer and inside the interconnects as shown in FIG. 5. The top side, back side pads 47 and 46, interconnect 48 are a metal which form Schottky junctions with the substrate. Like reference numbers have been applied to parts like in FIGS. 2 and 3. With a reverse bias dc voltage applied to the Schottky diode, the high resistivity (>1000 ohm-cm) silicon substrate is fully depleted of electrons. Thus a low capacitance is achieved.

The process flow for forming a wafer with through wafer interconnects of the type shown in FIG. 2 is shown in FIG. 7. We start with a 400 $\mu$m thick double-sided polished silicon wafer 51 which is thermally oxidized to 2 $\mu$m thick to serve as a hard mask for the deep etch. Both sides are then patterned with 20 $\mu$m diameter openings for each interconnect. A through-wafer deep etch is done by etching halfway from both sides of the wafer (FIG. 7a). By this means, a 20 to 1 high aspect ration via hole 54, can be achieved. The oxide mask is then removed by buffered oxide etch (BOE). For MIS isolation, interconnect side walls and wafer front and backside pads are grown with 1 $\mu$m of thermal oxide 56 (FIG. 7b). A layer 57 of 2 $\mu$m polysilicon is deposited and then heavily doped with boron or phosphorous depending on the wafer type to enhance the conductance (FIG. 7c). A layer 58 of low temperature oxide (LTO) is deposited to serve as an etching stop for the etch-back of polysilicon deposited in the following step. The interconnect holes are then filled with polysilicon 59 (FIG. 7d). The polysilicon on both sides is then etched back and stopped on the LTO (FIG. 7e). After removing the LTO, the 2 $\mu$m doped polysilicon is exposed again and ready to be etched for the front and back side oxide opening 61 (FIG. 7f). Another layer 62 of 0.5 $\mu$m polysilicon is deposited and doped with boron or phosphorous (FIG. 7g). The front and back side polysilicon pads are patterned followed by the oxide etch on the back side for ground opening 63 and heavily doped for ohmic contact. After this step, the array of devices can be built on top of the front side polysilicon.

The process flow for fabricating a wafer with through wafer interconnects of the type shown in FIG. 3 is shown in FIG. 8. We start with a 400 $\mu$m thick double-sided polished Si wafer 71 which is thermally oxidized to 2 $\mu$m thick 72 to serve as a hard mask for the deep etch. Both sides are then patterned with 20 $\mu$m diameter openings 73 for each interconnect (FIG. 8a). The through-wafer deep etch is done by etching half way from both sides of the wafer (FIG. 8b). By this means, a 20 to 1 high aspect ratio via hole can be achieved. The wafer is then heavily doped with boron or phosphorous 74 depending on the wafer type to build the pn junction diode inside the holes (FIG. 8c). The interconnect holes are then filled with polysilicon 76 (FIG. 8d). The polysilicon on both sides is then etched back and stopped on the oxide (FIG. 8e). It is ready to be etched for the front and back side oxide opening 77 (FIG. 8f). The wafer is then doped with boron 78 which makes up the pn junctions for the front and back side pads 81, 82. The oxide is etched on the back side for ground opening 63 and heavily doped for ohmic contact 83. After this step, the array of devices can be built on top of the front side pn junction pad.

The process flow for forming a wafer with through wafer interconnects of the type shown in FIG. 4 is shown in FIG.

9. We start with a 400 m thick double-sided polished silicon wafer 86 which is thermally oxidized to 2 m thick to serve as a hard mask for the deep etch. Both sides are then patterned with 20 m diameter openings for each interconnect. A through-wafer deep etch is done by etching halfway from both sides of the wafer (FIG. 9*a*). By this means, a 20 to 1 high aspect ration via hole 87, can be achieved. The oxide mask is then removed by buffered oxide etch (BOE). For MIS isolation, interconnect side walls and wafer front and backside pads are grown with 1 m of thermal oxide 88 (FIG. 9*b*). A layer 89 of 2 m polysilicon is deposited and then heavily doped with boron or phosphorous to enhance the conductance (FIG. 9*c*). A layer 91 of low temperature oxide (LTO) is deposited to serve as an etching stop for the etch-back of polysilicon deposited in the following step. The interconnect holes are then filled with polysilicon 92 (FIG. 9*d*). The polysilicon on both sides is then etched back and stopped on the LTO (FIG. 9*e*). After removing the LTO, the 2 m doped polysilicon is exposed again and ready to be etched for the front and back side pads 93, 94 patterning (FIG. 9*f*). The oxide is opened on the back side for ground opening 96 and heavily doped for ohmic contact. After this step, the array of devices can be built on top of the front side polysilicon.

Referring to FIG. 10, a wafer 101 with through via interconnects 102 and top side and bottom side pads 103 and 104 is schematically shown. This wafer is flip chip bonded to a integrated or processing circuit 106 or to a printed circuit board by solder bumps 107. Trenches 108 are etched in the wafer to reduce lateral stiffness at the surface of the wafer. Stress induced by thermal expansion differences between the wafer and associated connected devices is reduced, extending the lifetime of the assembly by reducing fatigue due to the thermal expansion differences.

A wafer with high density and low parasitic capacitance electrical through-wafer interconnects (vias) for connection to an array of micromachined transducers or devices on a silicon wafer has been described. The wafer provides vertical wafer feedthroughs (interconnects) connecting an array of sensors or actuators from the front side (transducer side) to the backside (packaging side) of the wafer. A 20 to 1 high aspect ratio 400 $\mu$m long and 20 $\mu$m diameter interconnect is achieved by using deep reactive ion etching (DRIE). Reduction of the parasitic capacitance to the substrate is achieved using reverse-biased pn junction diodes. A parasitic capacitance of 0.05 pF has been demonstrated by this approach. This three-dimensional architecture allows for elegant wafer-level packaging through simple flip-chip bonding of the chip's backside to a printed circuit board (PCB) or a signal processing circuit.

What is claimed is:

1. A wafer having front side and back side surfaces and through wafer interconnects characterized in that said interconnects comprise:
    a plurality of spaced vias extending between the front side and back side surfaces of said wafer;
    a conductor within said vias extending to said front side and back side surfaces; and
    conductive pads on the front side and back side surfaces in electrical contact with the ends of said conductor, said front and back side surfaces comprising an n-type or p-type material forming a pn junction between said pads and said wafer whereby to form depletion regions in said wafer opposite the pads and means for applying reverse bias to the said pn junction to increase the width of the said depletion region.

2. A wafer as in claim 1 in which said conductor vias comprises n-type or p-type material forming a pn junction between said conductor and said wafer whereby to form depletion regions in said wafer opposite said conductor and means for applying a reverse bias to the said pn junction to increase the width of the said depletion region.

3. A wafer as in claim 1 or 2 in which the conductor and pads are metal and form a Schottky junction with the wafer and increase the width of the said depletion region by applying a reverse bias to the said Schottky junction.

4. A wafer as in claims 1 or 2 in which the conductor and pads form an MIS junction with wafer.

5. A two-dimensional device array comprising:
    a plurality of devices formed on the front side of a wafer;
    a plurality of spaced vias at least one for each of said devices extending between the front side and back side surfaces of said wafer;
    a conductor within said vias extending between said front side and back side surfaces;
    a conductive pad for each of said devices on the front side of said wafer and in electrical contact with the conductor, said conductive pad comprising an n-type or p-type material forming a pn junction with said wafer to form a depletion region in said wafer opposite said pad and means for applying a reverse bias to the said pn junction to increase the width of the said depletion region; and
    a conductive pad on the back side of said wafer in electrical contact with the conductor, said conductive pad comprising n-type or p-type material forming a pn junction with the wafer to form a depletion region in said wafer opposite to the pads and means for applying a reverse bias to the said pn junction to increase the width of the said depletion region.

6. A two-dimensional device array as in claim 5 in which said via conductor comprises n-type or p-type material forming a pn junction between said conductor and said wafer whereby to form depletion regions in said wafer opposite said conductor and means for applying a reverse bias to the said pn junction to increase the width of the said depletion region.

7. A two-dimensional device array as in claim 5 or 6 in which the pads and conductor are metal which form a Schottky junction with the wafer and means for applying a reverse bias to the said Schottky junction to increase the width of the said depletion region.

8. A two-dimensional device array comprising:
    a plurality of devices formed on the front side of a wafer;
    a plurality of spaced vias at least one for each of said devices extending between the front side and back side surfaces of said wafer;
    a conductor within said vias extending between said front side and back side surfaces; and
    a conductive pad for each of said devices on the front side of said wafer and in electrical contact with the conductor, said conductor and conductive pad isolated from the wafer by a rectifying junction and means for applying a reverse bias voltage across said junction to form a wide depletion region and decrease the parasitic capacitance between said conductor and pads and the wafer.

9. A two-dimensional array as in claim 8 in which the junction is a pn junction.

10. A two-dimensional array as in claim 8 in which the junction is an MIS junction.

11. A two-dimensional array as in claim 8 in which the junction is a Schottky junction.

12. A two-dimensional array as in claim 8 in which the junction between the pads and wafer is a pn junction and the junction between the conductor and wafer is an MIS junction.

13. A wafer having front side and back side surfaces and through wafer interconnects characterized in that said interconnects comprise:
   a plurality of spaced bias extending between the front side and back side surfaces of said wafer;
   a conductor within said bias extending to said front side and back side surfaces; and conductive pads on the front side and back side surfaces in electrical contact with the ends of said conductor,
   means forming a junction between said conductor and pads and said wafer to form a depletion region; and
   wherein the depletion region can be increased by the application of a reverse bias voltage to said junctions.

14. A wafer as in claim 13 wherein the junction is a Schottky junction.

15. A wafer as in claim 13 wherein the junction is an MIS junction.

16. A wafer as in claim any one of 13, 14 and 15 including means for applying a reverse bias voltage to said junction to increase the width of the depletion region.

17. An array of ultrasonic transducer devices comprising:
   a plurality of devices formed on the front side of a wafer;
   a plurality of spaced vias at least one for each of said devices extending between the front side and back side surfaces of said wafer;
   a conductor within said vias extending between said front side and back side surfaces;
   a junction between said conductor and said wafer to form a depletion region between said conductor and wafer;
   a conductive pad for each of said devices on the front side of said wafer and in electrical contact with the conductor,
   a junction between said conductive pad and said wafer to form a depletion region in said wafer opposite said pad;
   a conductive pad on the back side of said wafer in electrical contact with the conductor; and
   a junction between said conductive pad and said wafer to form a depletion region in said wafer opposite to the pads.

18. A wafer as in claim 17 wherein the junction is a Schottky junction.

19. A wafer as in claim 17 wherein the junction is an MIS junction.

20. A wafer as in claims any one of 17, 18 and 19 including means for applying a reverse bias voltage to said junction to increase the width of the depletion region.

* * * * *